(12) United States Patent
Lewis et al.

(10) Patent No.: US 9,166,570 B2
(45) Date of Patent: *Oct. 20, 2015

(54) APPARATUS FOR USING METASTABILITY-HARDENED STORAGE CIRCUITS IN LOGIC DEVICES AND ASSOCIATED METHODS

(71) Applicant: Altera Corporation, San Jose, CA (US)

(72) Inventors: David Lewis, Toronto (CA); Jeffrey Christopher Chromczak, Brownsville (CA); Ryan Fung, Mississauga (CA)

(73) Assignee: Altera Corporation, San Jose, CA (US)

( * ) Notice: Subject to any disclaimer, the term of this patent is extended or adjusted under 35 U.S.C. 154(b) by 102 days.

This patent is subject to a terminal disclaimer.

(21) Appl. No.: 13/964,901

(22) Filed: Aug. 12, 2013

(65) Prior Publication Data

US 2013/0328607 A1 Dec. 12, 2013

Related U.S. Application Data

(63) Continuation of application No. 13/149,774, filed on May 31, 2011, now Pat. No. 8,508,254, which is a continuation of application No. 12/563,088, filed on Sep. 18, 2009, now Pat. No. 7,977,975.

(51) Int. Cl.
*H03K 19/00* (2006.01)
*H03K 3/356* (2006.01)
*H03K 3/037* (2006.01)
*H03K 19/003* (2006.01)
*H03K 19/177* (2006.01)

(52) U.S. Cl.
CPC ........ *H03K 3/356008* (2013.01); *H03K 3/0375* (2013.01); *H03K 19/00315* (2013.01); *H03K 19/17764* (2013.01)

(58) Field of Classification Search
CPC ..................... H03K 19/0375; H03K 19/17764
USPC .................................................. 326/26, 27, 93
See application file for complete search history.

(56) References Cited

U.S. PATENT DOCUMENTS

2014/0333361 A1* 11/2014 Chau et al. .................... 327/175

* cited by examiner

*Primary Examiner* — Don Le
(74) *Attorney, Agent, or Firm* — Law Offices of Maximilian R. Peterson

(57) ABSTRACT

An integrated circuit (IC) includes a set of metastability-hardened storage circuits. Each metastability-hardened storage circuit may include: (a) a pulse width distortion circuit; (b) a first circuit powered by a nominal power supply voltage, and a second circuit powered by a higher-than-nominal supply voltage; (c) an inverter and a bias circuit, where the bias circuit provides a bias current based on an intermediate state of the inverter to resolve a metastable state of the inverter; or (d) a latch, and a dynamic bias circuit that causes current to be injected into the latch to resolve a metastable state of the latch.

20 Claims, 16 Drawing Sheets

Level Converter

APPARATUS FOR USING METASTABILITY-HARDENED STORAGE CIRCUITS IN LOGIC DEVICES AND ASSOCIATED METHODS

CROSS-REFERENCE TO RELATED APPLICATIONS

This application is a continuation of co-pending application Ser. No. 13/149,774, filed on May 31, 2011, titled 'Apparatus for Using Metastability-Hardened Storage Circuits in Logic Devices and Associated Methods,' which is a continuation of application Ser. No. 12/563,088, filed on Sep. 18, 2009, titled 'Apparatus for Using Metastability-Hardened Storage Circuits in Logic Devices and Associated Methods,' now U.S. Pat. No. 7,977,975, issued on Jul. 12, 2011. The foregoing documents are hereby incorporated by reference in their entireties for all purposes.

TECHNICAL FIELD

The disclosed concepts relate generally to electronic circuits. More particularly, the disclosed concepts relate to apparatus and methods for providing and using metastability-hardened storage circuits in electronic circuits.

BACKGROUND

Advances in microelectronics have enabled the continued increase in transistor densities of integrated circuits (ICs). Advanced ICs can include hundreds of millions of transistors. The relatively large number of transistors enables circuit designers to integrate a relatively large number of functions.

The design of the chips entails competing factor or considerations, such as speed, power dissipation, and cost. Advances in fabrication techniques, such as complementary metal oxide semiconductor (CMOS), have resulted in the scaling of various parameters, such as power supply voltage, threshold voltages, and current-drive capabilities. Designers continually strive to improve device and, hence circuit and system reliability and performance in light of those changes.

SUMMARY

The disclosed concepts relate generally to improving the reliability and operation of electronic circuits, such as ICs. More specifically, the disclosed concepts provide apparatus and methods for providing and using metastability-hardened storage circuits (or synchronizers) in electronic circuits.

In one exemplary embodiment, an IC includes a set of metastability-hardened storage circuits. Each metastability-hardened storage circuit may include: (a) a pulse width distortion circuit; (b) a first circuit powered by a nominal power supply voltage, and a second circuit powered by a higher-than-nominal supply voltage; (c) an inverter and a bias circuit, where the bias circuit provides a bias current based on an intermediate state of the inverter to resolve a metastable state of the inverter; or (d) a latch, and a dynamic bias circuit that causes current to be injected into the latch to resolve a metastable state of the latch.

In a second exemplary embodiment, an IC includes a metastability-hardened storage circuit. The metastability-hardened storage circuit including a pulse width distortion circuit. In a third exemplary embodiment, an IC includes a metastability-hardened storage circuit that is powered by a nominal supply voltage and by a supply voltage that is higher than the nominal supply voltage.

In a fourth exemplary embodiment, an IC includes a metastability-hardened storage circuit. The metastability-hardened storage circuit includes an inverter and a dynamic bias circuit. The dynamic bias circuit provides a bias current to resolve a metastable state of the inverter.

In a fifth exemplary embodiment, an IC includes at least one metastability-hardened storage circuit. The metastability-hardened storage circuit includes a latch and a dynamic bias circuit. The dynamic bias circuit causes current to be injected into the latch to resolve a metastable state of the latch, and ceases the injection of current into the latch when the metastable state of the latch resolves.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to improving the reliability and operation of electronic circuits, such as ICs. More specifically, the disclosed concepts provide apparatus and methods for providing and using metastability-hardened storage circuits (or synchronizers) in electronic circuits. Examples of storage circuits include latches and flip-flops.

Storage circuits, such as flip-flops (typically used as synchronizers between two asynchronous clock domains), take a finite amount of time to resolve the logical value of their outputs. The amount of time increases as the interval of time between change in the input to the storage circuit and the sampling instant based on the clock signal shrinks. Under those circumstances, typically a latch inside the flip-flop may become metastable and take a relatively long time to resolve to a stable logic 1 or 0 value at its output.

Figure 1A:
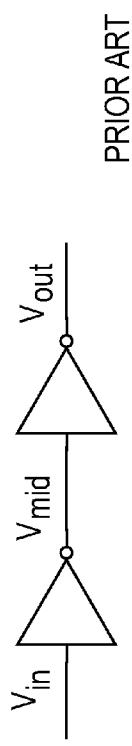
FIGS. 1A-1C illustrate a conventional flip-flop and its related small-signal circuits.
Figure 1B:
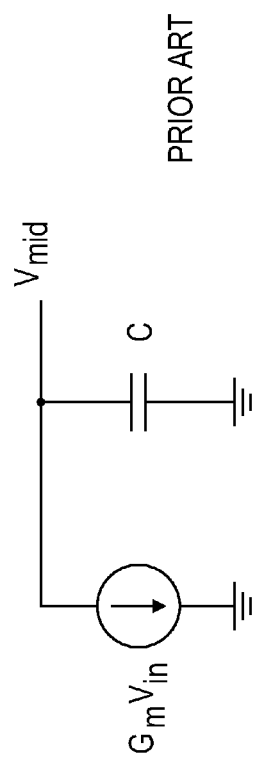
Figure 1C:
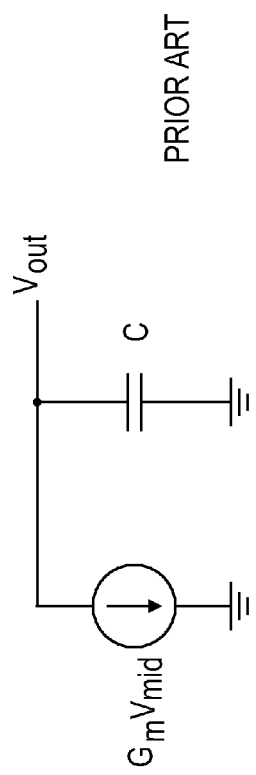

FIGS. 1A-1C illustrate a conventional flip-flop and its related small-signal circuits. The structure, operation, and behavior of the flip-flop in FIGS. 1A-1C falls within the knowledge of persons of ordinary skill in the art.

One may express the failure rate, r, of a flip-flop sampling asynchronous data with switching rate $F_{data}$, and clocked at $F_{clk}$ is given by:

$$r = \frac{c_1 \times F_{data} \times F_{clk}}{e^{t_{met}/c_2}}$$

where $F_{data}$ denotes the frequency of the data transitions, $F_{clk}$ represents the frequency of the sampling clock, and $t_{met}$ is the resolution time available for the sampling flip-flop to resolve to a logic 0 or 1 (i.e., the timing slack available in the flip-flop to flip-flop path).

The constant $c_1$ represents the sampling window of the flip-flop. Constant $c_2$ denotes the time constant of the flip-flop. As persons of ordinary skill in the art understand, the exponential dependence of the failure rate on the timing slack and the constant $c_2$ makes it desirable to provide as small a $c_2$ as possible.

The evolution of modern very large scale integration (VLSI) processes results in a trend towards a worsening of the constant $c_2$. To understand the reason, one may use a small-signal analysis of the behavior of a latch (for example, as used in the flip-flop of FIG. 1A) while in a metastable state.

Referring to FIGS. 1A-1C, consider a latch biased at some small voltage from the metastable point, where the input and output voltages are the same, i.e., Vin=Vout. As the voltage diverges from this metastable point, a simple circuit analysis can show that each inverter in the flip-flop has some small difference in voltage input that causes a current output of Gm*Vin, where Vin represents the difference from the metastable point. In other words, the voltages Vin, Vmid (voltage between the two latches or inverters in the flip-flop), and Vout are defined with respect to the metastable point, so at metastability Vin=Vmid=Vout=0.

Assuming for simplicity that the inverters in the flip-flop of FIG. 1A are identical, a simple circuit analysis shows that their outputs will have a voltage waveform given by:

$$v(t) = e^{\frac{g_m t}{C}},$$

where C includes the load capacitance and the Miller effect applied to any gate-to-drain capacitance of the flip-flop transistors. The time constant $c_2$ is directly related to the exponential divergence of the inverters, such that $c_2 \approx C/g_m$.

Thus a large value of $g_m$ is typically used to achieve a small value of $c_2$. In general, the value of $c_2$ is limited by the intrinsic properties of the transistor. The intrinsic properties of the transistor in turn are limited by the fabrication process.

As persons of ordinary skill in the art understand, $g_m$ depends on the voltages of the metastable point, where:

$$V_{gs} \approx V_{ds} \approx \frac{V_{dd}}{2}.$$

Consequently, one obtains:

$$g_m \approx k \times \left\{ \frac{V_{dd}}{2} - V_t \right\},$$

where $V_t$ represents the transistor threshold voltage.

In modern processes, the transistor threshold voltage $V_t$ can approach or, at slow process corners and adverse operational conditions, even exceed the midpoint of the supply voltage, $$\frac{V_{dd}}{2},$$

with the result that $g_m$ approaches zero, and $c_2$ can become relatively large. As a result, the resolution time of the metastable latch increases.

For example in a modern technology operating at a low supply voltage of 0.8V, where at a slow process corner the threshold voltage $V_t$ is 350 mV, the value of $$\left\{ \frac{V_{dd}}{2} - V_t \right\}$$

would only be 50 mV. As a comparison, in an older process with, say supply voltages of 1.9V and threshold voltages of 450 mV, one would have value of $$\left\{ \frac{V_{dd}}{2} - V_t \right\}$$

of 500 mV (about an order of magnitude larger). Thus, the constant $c_2$ can increase by a relatively large factor in modern processes because of the decreases in the supply voltage $V_{dd}$.

The increase in $c_2$ has ramifications for designs that communicate data between unrelated or unsynchronized clock domains. In such scenarios, synchronizers are used to transfer data between the clock domains and, with degrading values of $c_2$, it can take perhaps 10 or 15 stages of flip-flops (compared to, say, 2 or 3 stages in older technology), to reliably synchronize data.

The larger number of flip-flops increases latency, and costs silicon area. Furthermore, the relatively large silicon areas used in flip-flop chains often prohibits the use of relatively large flip-flop chains to make robust synchronizers at every flip-flop or even a large number of flip-flop locations in an IC or electronic circuit.

One aspect of the disclosed concepts relates to metastability-hardened storage circuits. Such storage circuits may include latches and flip-flops (e.g., implemented by coupling in cascade a pair of latches).

Figure 2:
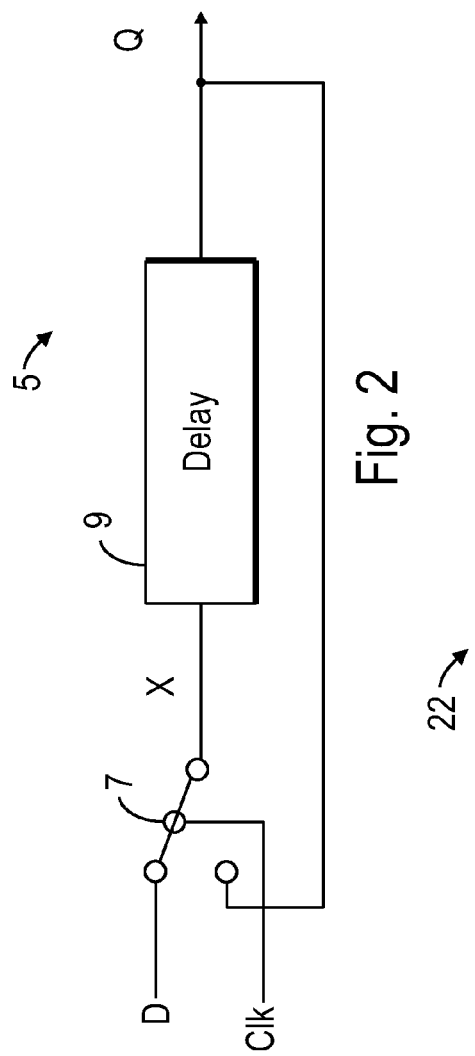
FIG. 2 depicts a metastability-hardened storage circuit according to an exemplary embodiment.

FIG. 2 depicts a metastability-hardened storage circuit according to an exemplary embodiment. More specifically, the storage circuit in the embodiment shown constitutes a latch 5.

Latch 5 has an input d, and an output q. Latch 5 includes a switch 7, and a delay circuit 9. Switch 7 and delay circuit 9 are coupled in a feedback loop, with the output of delay circuit 9 coupled to switch 7.

Clock signal clk controls the operation of switch 7. In one embodiment, when the clock signal has a logic 0 value, switch 7 couples the output of delay circuit 9 to input x of delay circuit 9, thus forming a feedback loop. Conversely, when the clock signal has a logic 1 value, switch 7 couples input d of latch 5 to input x of delay circuit 9.

Figure 3:
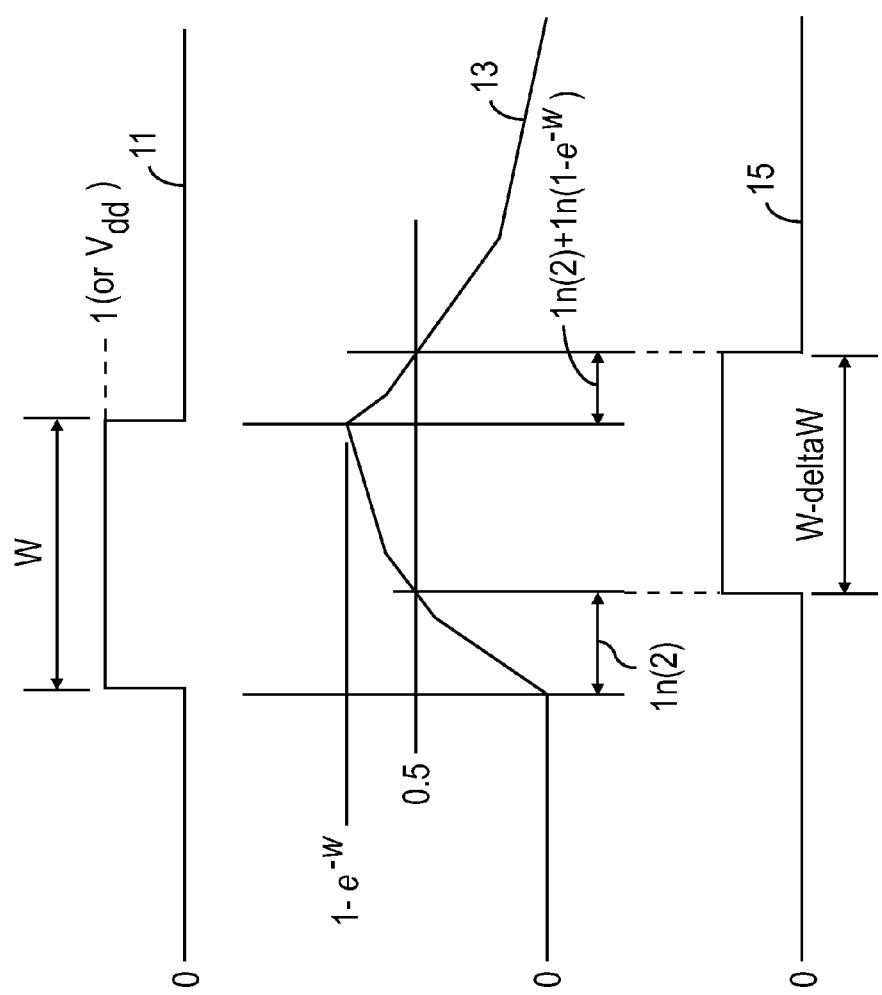
FIG. 3 shows a set of waveforms corresponding to pulse width distortion employed to resolve metastability.

The feedback loop in FIG. 2 includes pulse width distortion as a metastability resolution mechanism. FIG. 3 shows a set of exemplary waveforms corresponding to pulse width distortion employed to resolve metastability.

Specifically, waveform 11 corresponds to an input pulse, having a width or duration of W. Waveform 13 shows a first-order resistor-capacitor (RC) approximation of the output signal of latch 5 (see FIG. 2), showing pulse width distortion. Finally, waveform 15 depicts the metastability-resolved output signal (by operation of pulse width distortion).

Note that pulse width distortion alters the duration of the pulse in signal 15. Specifically, in the example shown, pulse width distortion reduces the width of the output pulse to W-deltaW (even though the input pulse has a width W).

Referring to FIG. 2, when switch 7 closes the feedback loop, a pulse applied at the input of delay circuit 9 is delayed by delay circuit 9, and the resulting pulse applied to the input of delay circuit 9 via switch 7. This configuration produces pulse width distortion, which causes latch 5 to resolve its output, and thus leave the metastable region of operation. If the duty cycle of input x does not correspond exactly the metastable point, the output q of latch 5 will tend to drift away from it, and eventually resolve to a logic 0 or 1. Thus, pulse width distortion drives latch 5 from a metastable state into a stable one.

The metastable point of latch 5 propagates an oscillation around the loop, including essentially rail-to-rail transitions. Because of the rail-to-rail transitions, $$\left\{\frac{V_{dd}}{2} - V_t\right\}$$

does not pose a limitation on the operation of latch 5.

Generally speaking, delay circuit 9 may be implemented by using a set of devices or circuits that have sufficient transport delay to temporarily sustain an oscillation. In one exemplary embodiment, one may implement delay circuit 7 by using four or more inverters. (If non-inverting logic gates are available, three or more such devices may suffice.) As persons of ordinary skill in the art who have the benefit of the description of the disclosed concepts understand, one may implement delay circuit 9 using a variety of other devices and circuits, as desired.

Figure 4:
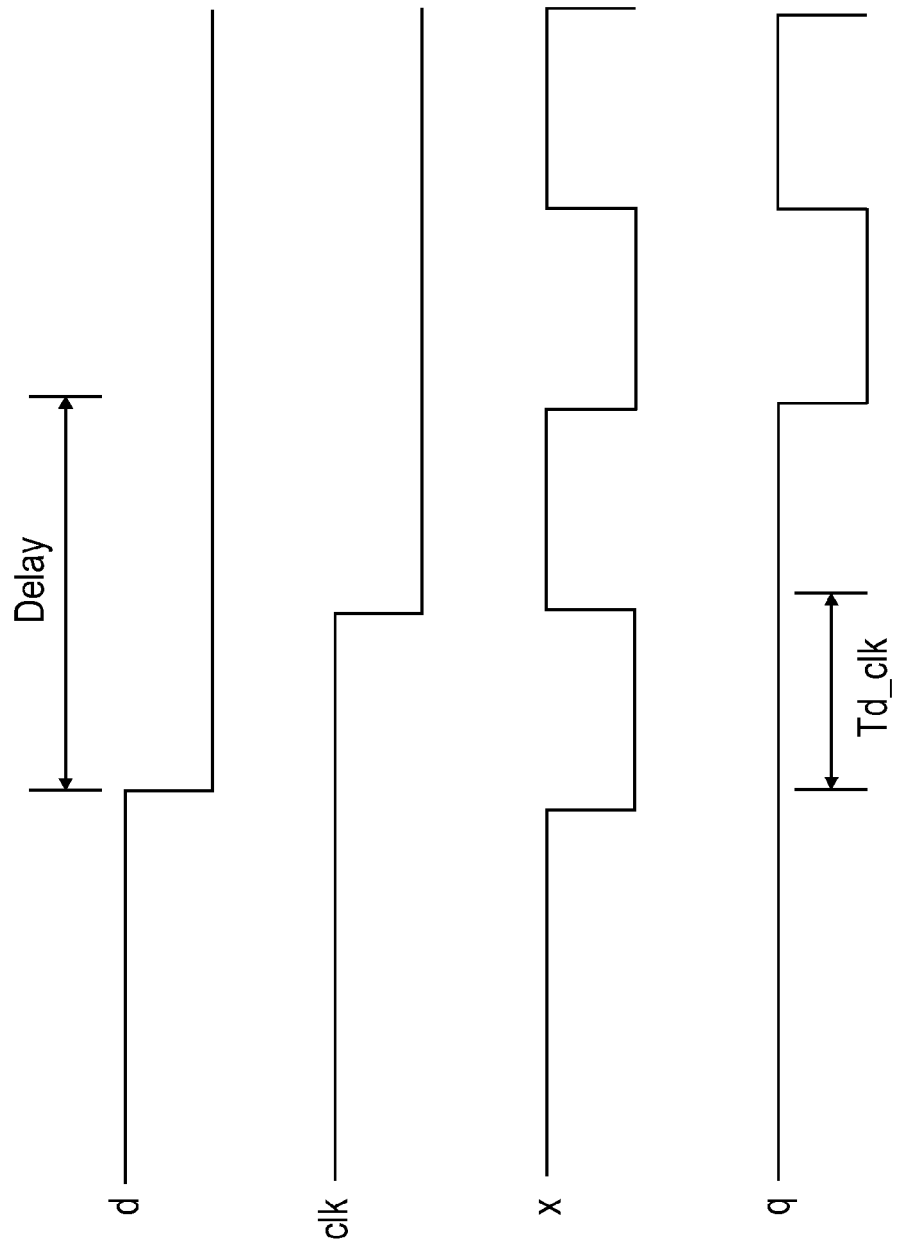
FIG. 4 depicts shows a set of waveforms corresponding to various signals in the latch shown in FIG. 2.

FIG. 4 shows a set of waveforms (clk, d, x, and q) corresponding to various signals in latch 5 of FIG. 2. The time period denoted as "delay" corresponds to the time delay produced by delay circuit 9. The time period labeled as Td_clk represents the delay from the input d to a transition in clock signal clk. (Note that FIG. 4 does not show the final resolution to a stable output value.)

As noted, one may implement latch 5 (see FIG. 2) using a chain of inverters. In some embodiments, one may use an even number of inverters coupled in a chain (in a cascade fashion) to implement delay circuit 9 (see FIG. 2).

Figure 5:
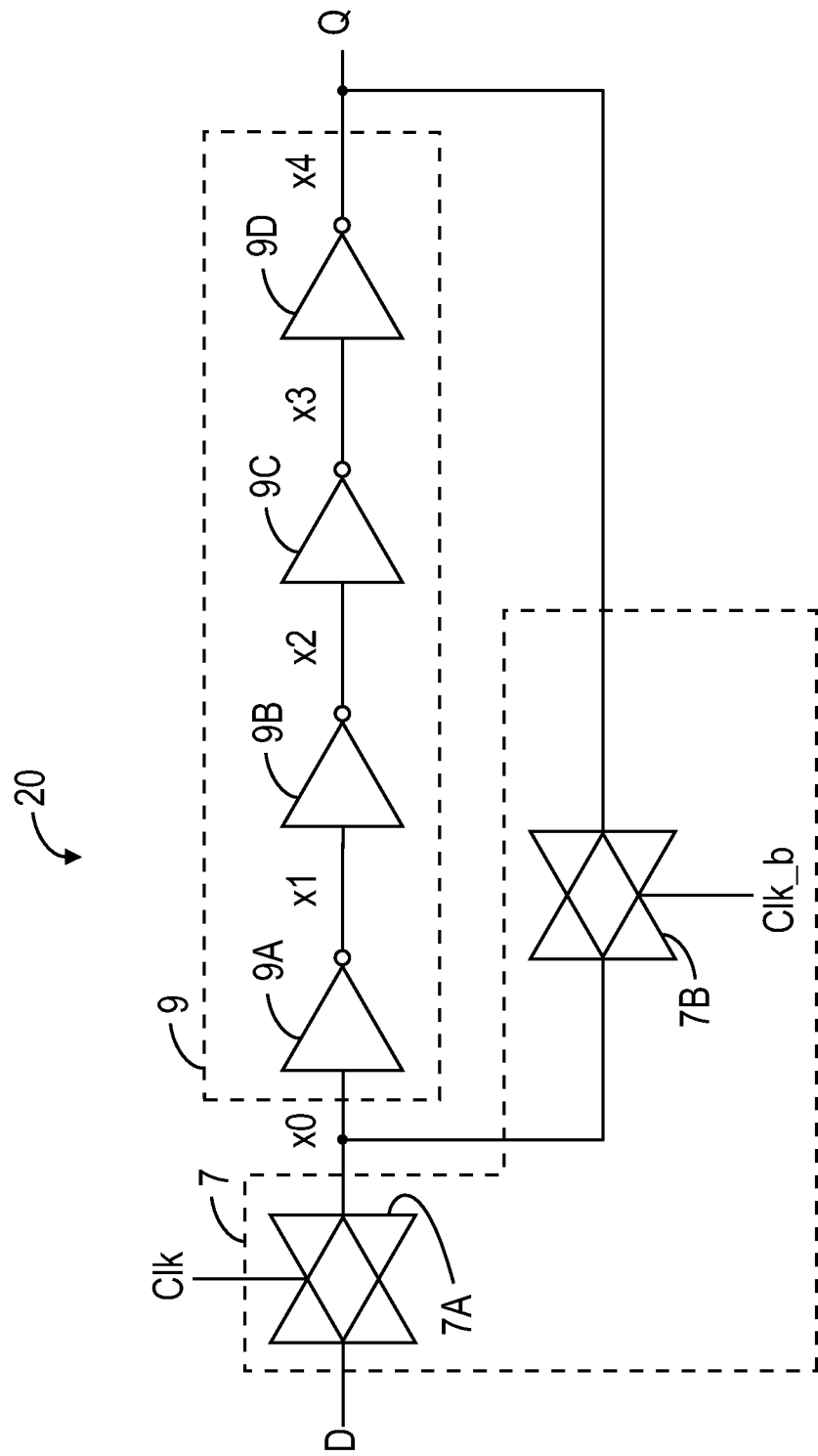
FIG. 5 illustrates an exemplary embodiment of a latch that employs pulse width distortion to achieve metastability-hardness.

FIG. 5 illustrates an exemplary embodiment of a latch 20 that employs pulse width distortion to address metastability. Latch 20 includes a chain of four inverters, coupled in a cascade fashion) 9A-9D, transmission gate 7A, and transmission gate 7B.

Transmission gate 7A couples input signal d to the input of the chain of inverters 9A-9D under the control of clock signal clk. Transmission gate 7B couples the output of inverter 9D to the input of the chain of inverters 9A-9D under the control of the complement of the clock signal, labeled as clk_b.

Note that, as persons of ordinary skill in the art who have the benefit of the description of the disclosed concepts understand, one may use a different number of inverters, as desired. Furthermore, rather than using inverters, one may use other circuits, such as logic gates, buffers, etc., as desired. Furthermore, one may use circuitry or devices other than transmission gates to implement switch 7, as desired, and as persons of ordinary skill in the art who have the benefit of the description of the disclosed concepts understand.

Figure 6:
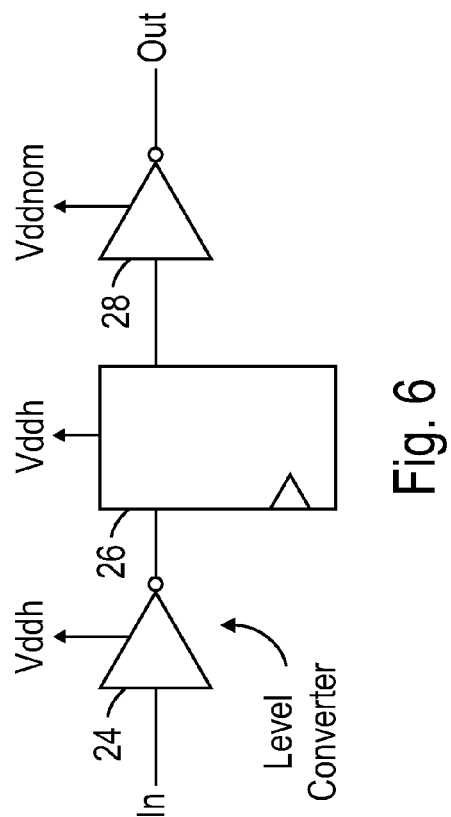
FIG. 6 shows a metastability-hardened storage circuit according to another exemplary embodiment.

FIG. 6 shows a metastability-hardened storage circuit 22 according to another exemplary embodiment. Storage circuit 22 includes inverter 24, flip-flop 26, and inverter 28.

Inverter 24 accepts the input of storage circuit 22. The output of inverter 24 couples to the input of flip-flop 26. The output of flip-flop 26 couples to the input of inverter 28. Inverter 28 provides the output of storage circuit 22.

Storage circuit 22 attains metastability-hardness by using a second, higher supply voltage. Specifically, inverter 24 and flip-flop 26 couple to a power supply (labeled as Vddh on FIG. 6) that has a higher than nominal voltage level. Inverter 28, however, couples to a nominal power supply (labeled as Vddnom on FIG. 6), having a nominal voltage level.

The power supply with the nominal voltage may supply power to circuitry coupled to storage circuit 22. For example, in some embodiments, one may integrate storage circuit 22 in an IC. In that scenario, storage circuit 22 may receive its input signal from other circuitry from the IC. Power supply Vddnom may power such circuits. As another example, storage circuit 22 may provide its output signal to other circuitry in an IC that receive power from power supply Vddnom.

Inverter 24 acts as a level converter that shifts the input signal of storage circuit 22 to a higher level. Specifically, storage circuit 22 receives input signals referenced to the nominal power supply, Vddnom. Inverter 24, which receives power from Vddh, provides an output signal referenced to Vddh.

Note that flip-flop 26 receives power from Vddh, and therefore its input and output signals are referenced to Vddh. In exemplary embodiments, inverter 24 and flip-flop 26 use relatively robust transistors, i.e., transistors that can properly and reliably operate from the higher supply voltage Vddh.

The use of such transistors, when supplied by Vddh, can result in a smaller value of $C_2$. The decreased value of $C_2$ results from the higher supply voltage which, for a given threshold voltage for the process technology, elevates the value of $$\left\{\frac{V_{dd}}{2} - V_t\right\}.$$

The smaller value of $C_2$ helps storage circuit 22 resolve its output when in a metastable state.

Inverter 28 also acts as a voltage converter. More specifically, inverter 28 converts the Vddh-referenced output signal of flip-flop 26 to a Vddnom-referenced output signal of storage circuit 22.

Figure 7:
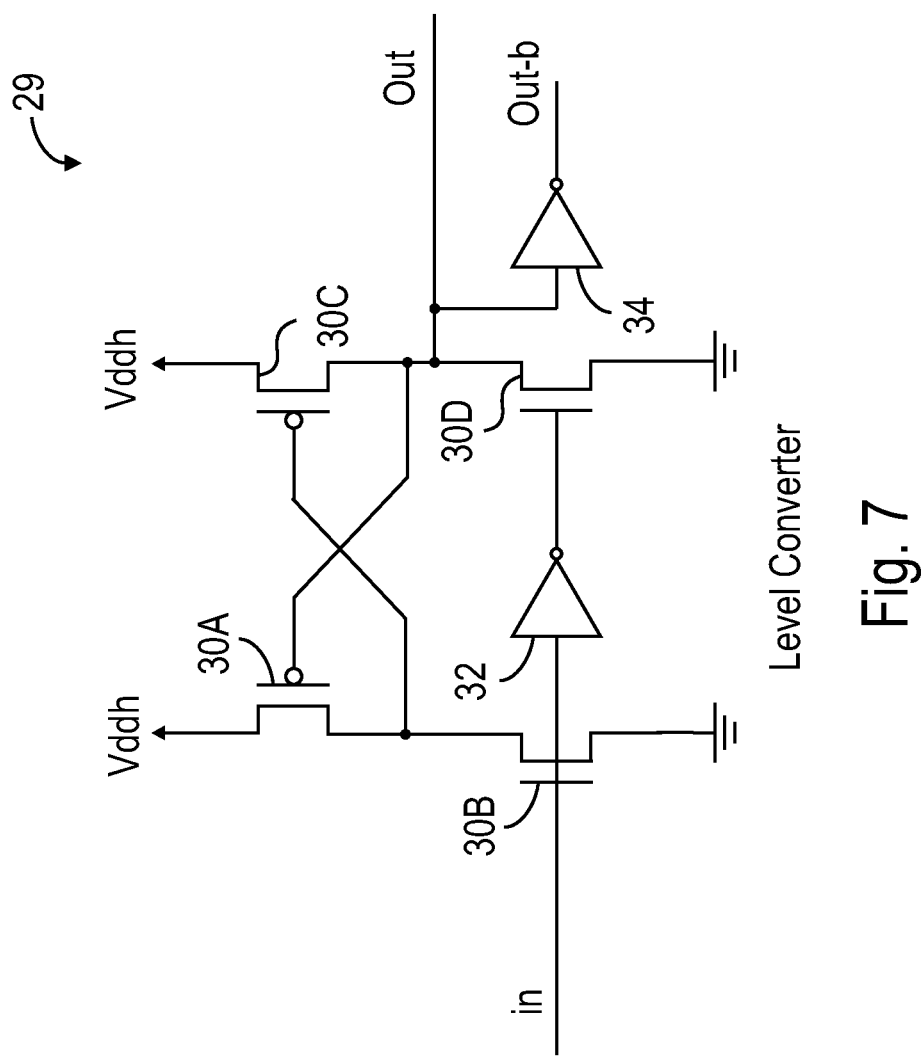
FIG. 7 illustrates a level converter circuit according to an exemplary embodiment.

FIG. 7 illustrates a level converter circuit 29 according to an exemplary embodiment. Level converter 29 includes transistor 30A-30D arranged in a cross-coupled fashion, powered from Vddh. The input signal, referenced to Vddnom, drives the gates of transistor 30B and, via inverter 32, transistor 30D. Optional inverter 34 provides a complementary output signal, as desired.

A logic 0 input signal causes transistors 30B and 30C to turn off, and transistors 30D and 30A to turn on. As a result, transistor 30A pulls the output voltage of level converter circuit 29 to near Vddh.

Conversely, a logic 1 input signal (Vddnom or near Vddnom) causes transistors 30D and 30A to turn off, and transistors 30B and 30C to turn on. Consequently, transistor 30D pulls the output voltage of level converter circuit 29 to near circuit ground potential.

Figure 8:
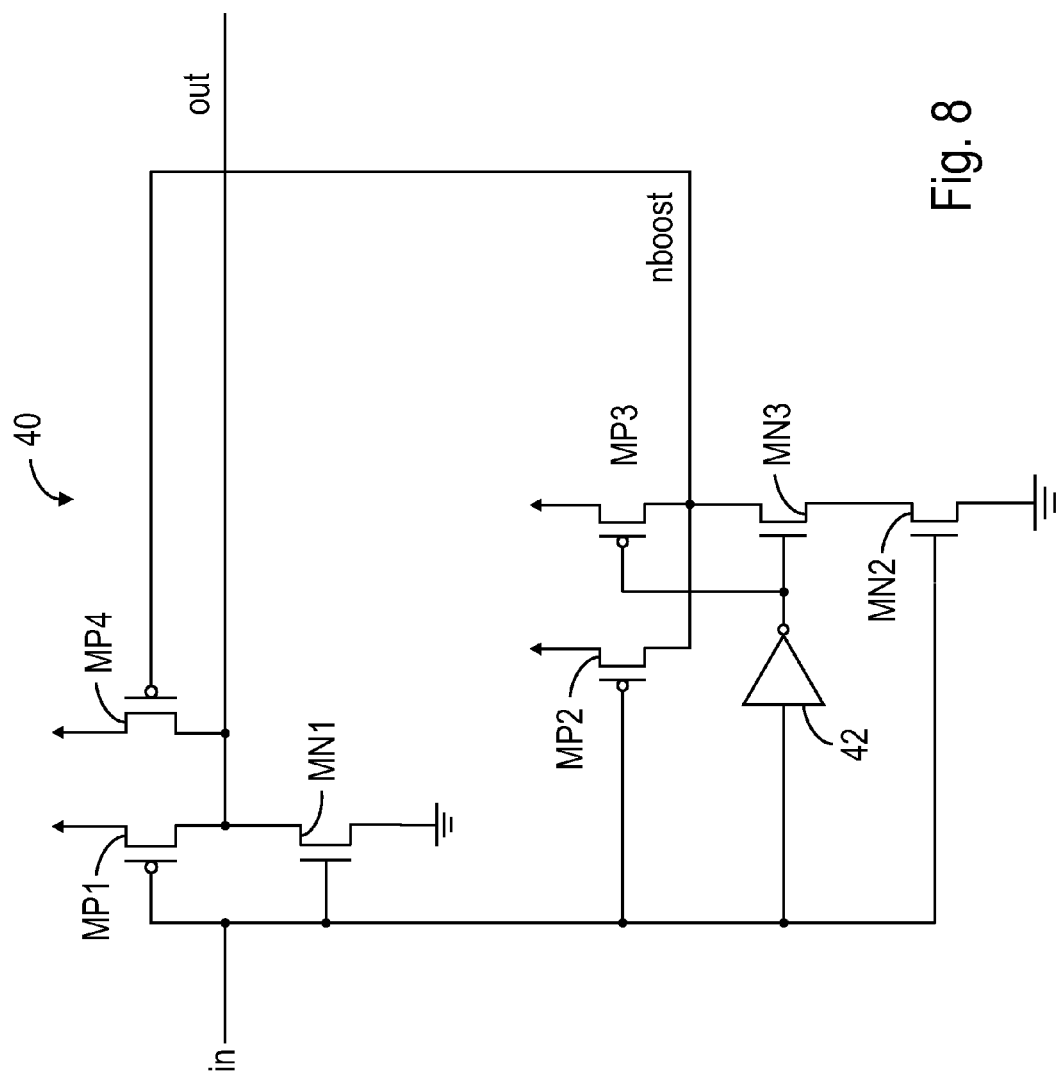
FIG. 8 shows an inverter circuit according to an exemplary that may be used to implement metastability-hardened storage circuits.

Another aspect of the disclosed concepts relates to storage circuits that detect an intermediate voltage (i.e., an output voltage between logic 0 and logic 1 during a metastable state), and provide an extra bias current to resolve the metastable state (i.e., a dynamic bias current). FIG. 8 shows an inverter circuit 40 according to an exemplary that one may use to implement metastability-hardened storage circuits, such as latches and flip-flops, as persons of ordinary skill in the art who have the benefit of the description of the disclosed concepts understand.

For example, one may use two inverter circuits 40 coupled in a cascade fashion to implement a latch. As another example, one may use a pair of such latches to implement a flip-flop.

Referring to FIG. 8, inverter circuit 40 includes p-type transistors MP1-MP4, inverter 42, and n-type transistors MN1-MN3. The input signal, in, drives the gates of transistors MP1-MP2, and MN1-MN2. The input signal also drives the input of inverter 42. The output of inverter 42 drives the gates of transistors MP3 and MN3.

Transistors MN1 and MP1 form an inverter. Transistor MP4 can inject a dynamic bias current to raise the voltage across MN1, and thus increase its transconductance, or $g_m$.

The injection of the bias current can occur at an intermediate voltage where both MN2 and MN3 are on, thus pulling down the node labeled nboost. The ratio of the sizes of the transistors in inverter circuit 42 is selected with a high logic switching threshold voltage (e.g., a higher than usual voltage is used so that the input and output voltages are the same or nearly the same) such that an intermediate voltage on the input in causes a logic 1 on the output. As a result, both MN3 and MN2 are on.

A storage circuit, such as a latch or flip-flop, constructed using inverter circuit will have an improved (i.e., lower) value of $c_2$. Consequently, such storage circuits will have improved metastability-hardness.

One may employ many variations of inverter circuit 40, as persons of ordinary skill in the art who have the benefit of the description of the disclosed concepts understand. For example, in one embodiment, inverter circuit 40 may include level shifters to apply a current from a boosted supply voltage during the intermediate voltage, while avoiding a larger than nominal supply voltage across any single transistor.

Figure 9:
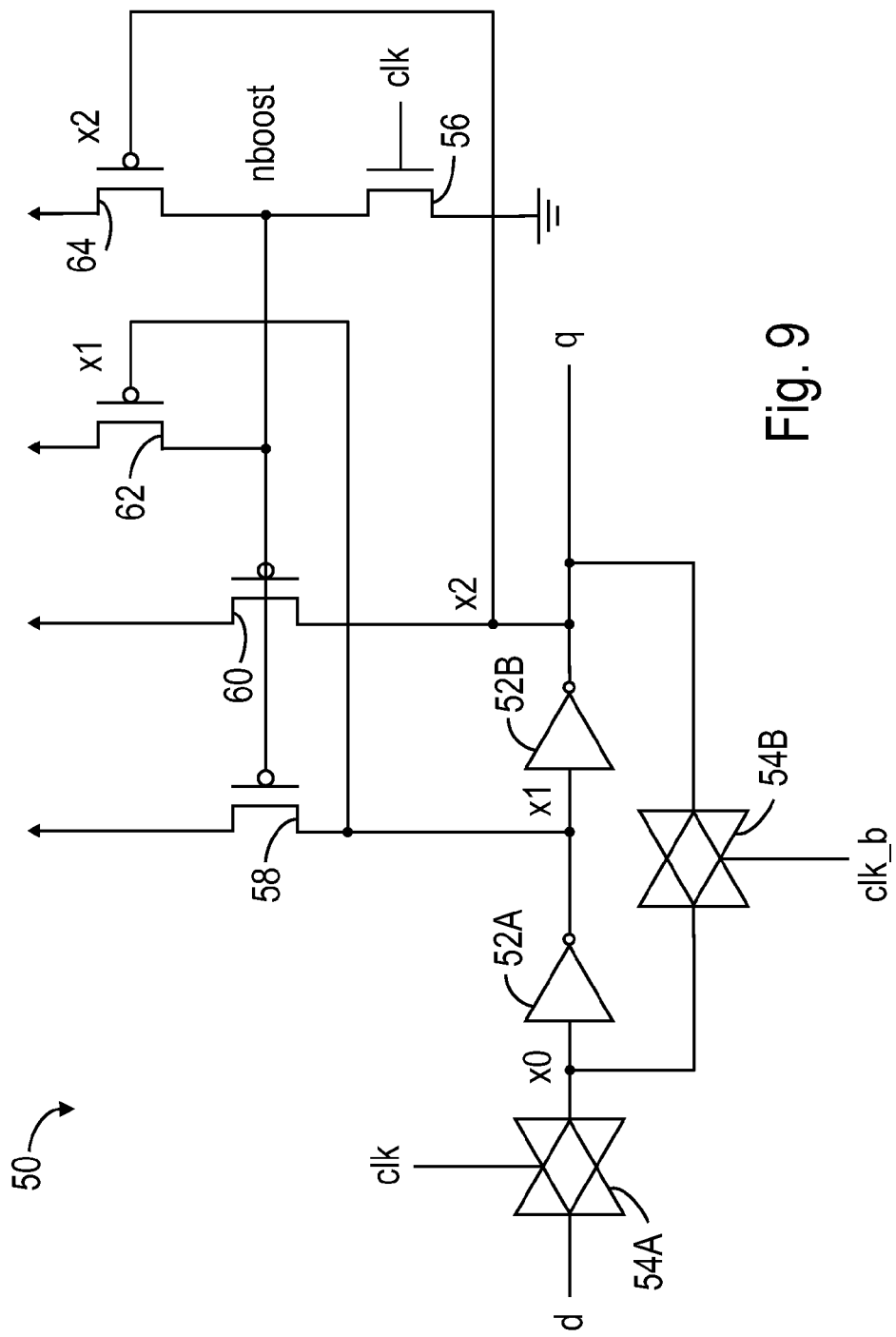
FIG. 9 illustrates a metastability-hardened storage circuit according to yet another exemplary embodiment.

FIG. 9 illustrates a metastability-hardened storage circuit 50 according to yet another exemplary embodiment. Storage circuit 50 includes a latch, and a boost circuit. Storage circuit 50 uses a precharge node which is pulsed to an active state that drives current into the latch when the latch is in a metastable state, and a circuit for resetting the node (extracting current from the node) when the metastable state resolves.

Inverters 52A-52B and transmission gates 54A-54B form a latch. Transistors 56, 58, 60, 62, and 64 form a boost circuit, as described below in detail.

When the clock signal, clk, is active, transistor 56 turns on, and the node nboost is pulsed low. Thus, extra current is driven into nodes x1 and x2 via transistors 58 and 60, respectively.

When one of nodes x1 and x2 resolves to a logic 0, the node nboost reverts back to a logic 1, thus eliminating the extra current. More specifically, if node x1 resolves to logic 0, transistor 62 turns on, and pulls node nboost to near the supply voltage. If, on the other hand, node x2 resolves to logic 0, transistor 64 turns on, thus pulling node nboost to near the supply voltage.

This phenomenon is especially appropriate for a pulse latch because of the contention current when the clock signal, clk, is asserted. Since a pulse latch uses a short clock pulse, the amount of contention is small. Optionally, a retainer latch may be used on the node nboost so it does not drift during the metastable event.

As noted, one may use the disclosed metastability-hardened storage circuits in a variety of circuits or devices, and for a range of applications. Examples of such circuits or devices include integrated circuits (ICs), application specific ICs (ASICs), general-purpose or special-purpose ICs, structured ASICs, field programmable gate arrays (FPGAs) programmable logic devices (PLDs), and the like.

Figure 10:
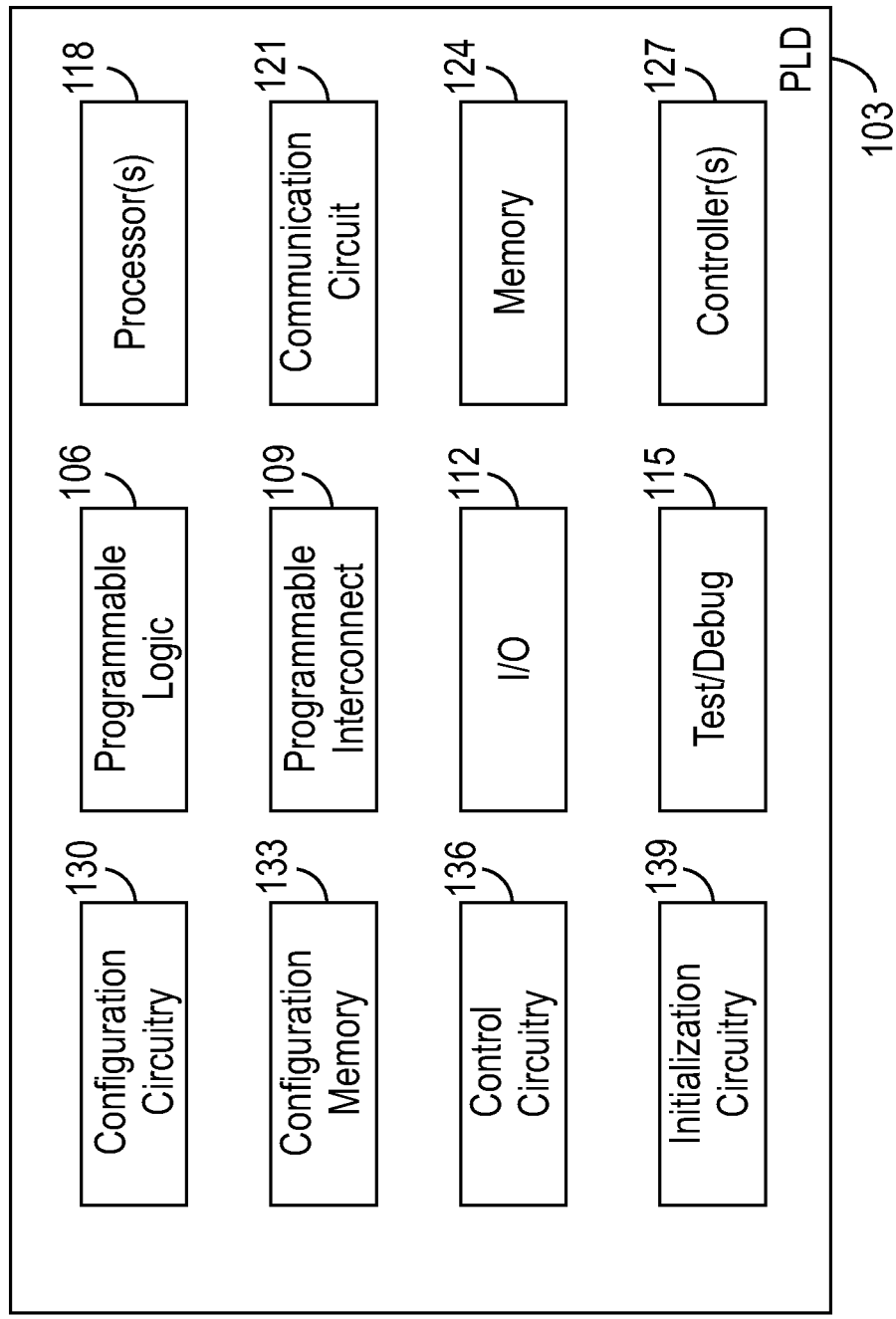
FIG. 10 depicts a general block diagram of a PLD that may use metastability-hardened storage circuits according to various exemplary embodiments.

FIG. 10 depicts a general block diagram of a PLD 103 that may use metastability-hardened storage circuits according to exemplary embodiments. For examples of techniques for placing metastability-hardened storage circuits (or synchronizers) in PLDs or other electronic circuits, see commonly owned U.S. patent application Ser. No. 12/563,095, filed on Sep. 18, 2009, titled "Apparatus for Improving System Performance and Resource Use and Associated Methods." Referring to FIG. 10, PLD 103 includes configuration circuitry 130, configuration memory (CRAM) 133, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, and initialization circuit 139, as desired.

Note that the figure shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode or mixed-signal circuitry, as desired.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside PLD 103.

Control circuitry 136 controls various operations within PLD 103. Under the supervision of control circuitry 136, PLD configuration circuitry 130 uses configuration data (which it obtains from an external source, such as a storage device, a host, etc.) to program or configure the functionality of PLD 103.

Configuration data are typically stored in CRAM 133. The contents of CRAM 133 determine the functionality of various blocks of PLD 103, such as programmable logic 106 and programmable interconnect 109. Initialization circuit 139 may cause the performance of various functions at reset or power-up of PLD 103.

I/O circuitry 112 may constitute a wide variety of I/O devices or circuits, as persons of ordinary skill in the art who have the benefit of the disclosure understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the disclosure. For example, test/debug circuitry 115 may include circuits for performing tests after PLD 103 powers up or resets, as desired. Test/debug circuitry 115 may also include coding and parity circuits, as desired.

PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the disclosure in this document appreciate.

One or more of processor(s) 118 may constitute a digital signal processor (DSP). DSPs allow performing a wide variety of signal processing tasks, such as compression, decompression, audio processing, video processing, filtering, and the like, as desired.

DSPs may include registers, multipliers, accumulators, shift registers, etc. One may use DSPs to implement a wide variety of digital circuitry, such as finite impulse response (FIR) filters, infinite impulse response (IIR) filters.

In some embodiments, the programmable fabric of the PLD includes a number of DSPs. For example, DSP blocks may be grouped into columns across the device.

PLD 103 may also include one or more communication circuits 121. Communication circuit(s) 121 may facilitate data and information exchange between various circuits within PLD 103 and circuits external to PLD 103, as persons of ordinary skill in the art who have the benefit of the disclosure in this document understand.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired.

Memory devices may include single-port memory, dual-port memory, double data rate (DDR) memory, etc., as desired. Memory devices may be grouped into columns across the device. In some embodiments, memory devices are placed between certain blocks of programmable logic, for example, between certain LABs or other circuitry or blocks.

Controller 127 allows interfacing to, and controlling the operation and various functions of circuitry outside the PLD. For example, controller 127 may constitute a memory controller that interfaces to and controls an external synchronous dynamic random access memory (SDRAM), as desired.

Figure 11:
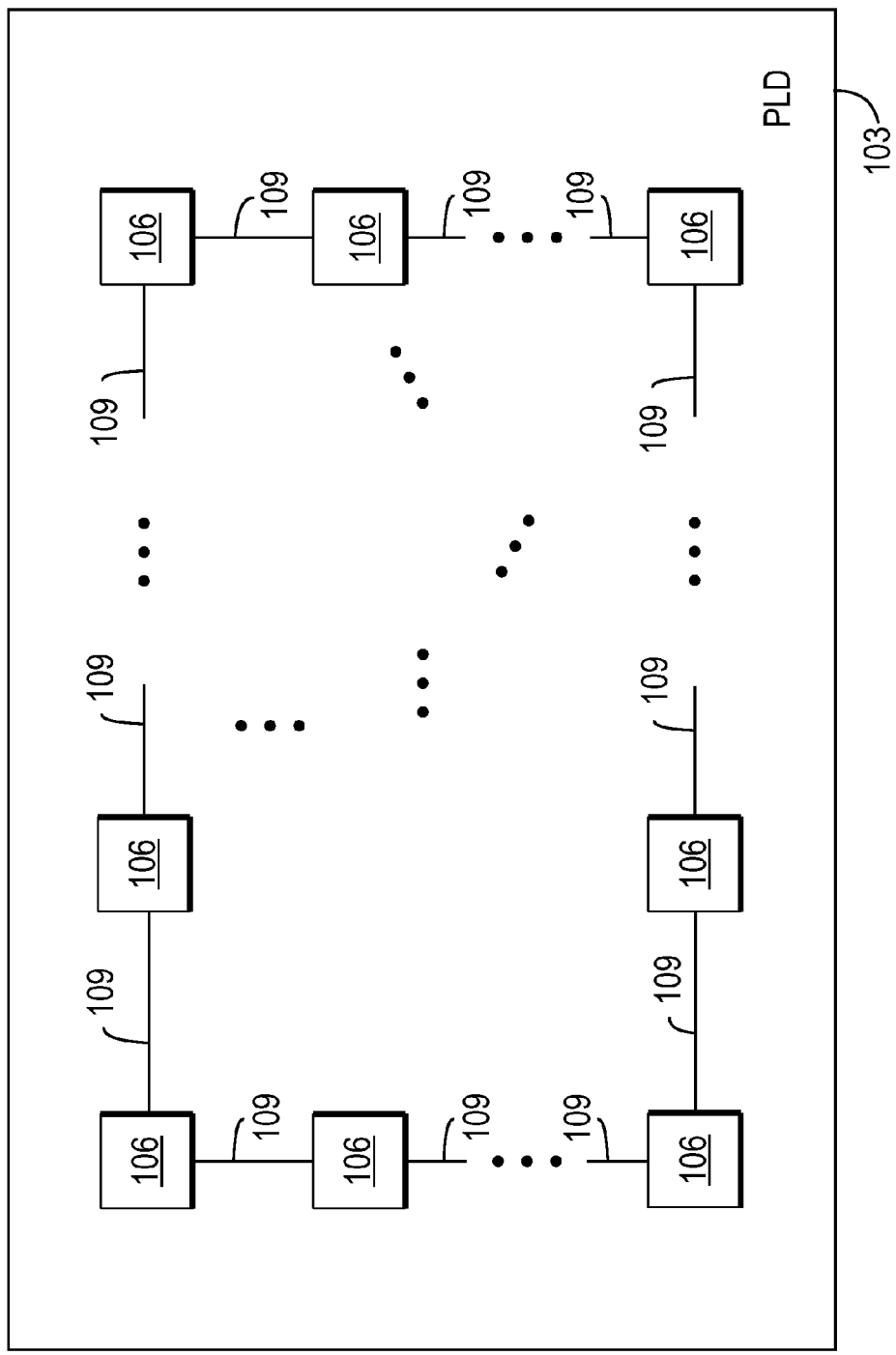
FIG. 11 shows a floor-plan of the PLD of FIG. 10, according to an exemplary embodiment.

FIG. 11 shows a floor-plan of PLD 103 according to an exemplary embodiment. A block, part of a block, or a set of blocks may constitute a tile or region of PLD 103.

PLD 103 includes programmable logic 106 arranged as a two-dimensional array. Programmable interconnect 109, arranged as horizontal interconnect and vertical interconnect, couples the blocks of programmable logic 106 to one another. Programmable interconnect 109 may have fixed or variable length and configuration, as desired. One may place the blocks in a particular manner so as to implement a user's design, as persons of ordinary skill in the art who have the benefit of the disclosure in this document understand.

In illustrative embodiments, PLD 103 has a hierarchical architecture. In other words, each block of programmable logic 106 may in turn include smaller or more granular programmable logic blocks or circuits. The types, levels, and granularity of the hierarchical architecture may differ in exemplary embodiments.

For example, in some embodiments, programmable logic 106 may constitute blocks of configurable logic named logic array blocks (LABs), and each LAB may include logic elements (LEs), adaptive logic modules (ALMs), or other circuitry, as desired. Each ALM may include at least one LUT and at least one flip-flop, any of which may be metastability-hardened. In addition to LEs and/or ALMs, in some embodiments a LAB may also include a secondary signal region (SS region) for control signal selection and conditioning. More specifically, the secondary signal region may contain circuit or hardware resources that can be shared by multiple ALMs in the LAB.

In other embodiments, the programmable logic may have different names, structures (e.g., hierarchical, circuitry), and/or functionality. For example, in some embodiments, the programmable fabric of the PLD or FPGA may include configurable logic blocks (CLBs). The CLBs may include one or more metastability-hardened storage circuits, as desired. Persons of ordinary skill in the art who have the benefit of this disclosure understand that a wide variety of other arrangements, with varying terminology and topology, are possible, and fall within the scope of the disclosed concepts.

Furthermore, although FIG. 11 shows blocks of programmable logic 106, one may use PLDs with other or additional blocks (e.g., memory, processors, other blocks in FIG. 10, blocks not shown in FIG. 10, etc.) in their floorplans and take advantage of metastability-hardened storage circuits according to the disclosed concepts, as persons of ordinary skill in the art who have the benefit of this disclosure understand. For example, in some embodiments, the PLD may include memory circuitry, such as blocks of memory, as part of the two-dimensional architecture of the PLD.

Regardless of a PLD's architecture, one may employ metastability-hardened storage circuits in any blocks or circuits in the PLD (such as PLD 103), as desired. As merely one example, one may use metastability-hardened storage circuits in the programmable fabric (e.g., programmable logic, programmable interconnect, processors, memory) of a PLD.

Furthermore, generally speaking, one may any include and use a desired and appropriate (depending on the application, specifications, technology used, etc.) number of metastability-hardened storage circuits (e.g., latches, flip-flops) in a PLD. Compared to other storage circuits (e.g., conventional latches and flip-flops), metastability-hardened storage circuits typically take up more silicon area, consume more power, or both. Thus, in some embodiments, a subset of the storage circuits in a PLD constitute metastability-hardened storage circuits.

In some embodiments, relatively high-speed interconnect (e.g., programmable interconnect 109) provides paths among at least some of the metastability-hardened storage circuits (e.g., from the output of one such storage circuit to the input of another). The use of those interconnect paths tends to increase the timing slack available.

FIGS. 12-17 illustrate simplified block diagrams of PLD configurations (e.g., a portion, tile, or block(s) of a PLD) that include metastability-hardened storage circuits, according to exemplary embodiments. The following description provides details of each configuration.

In some embodiments, some of the blocks of the programmable fabric of the PLD include metastability-hardened storage circuits. In one embodiment, some blocks of programmable logic (e.g., some ALMs) within the PLD include at least one metastability-hardened storage circuit (e.g., latch, flip-flop).

Figure 12:
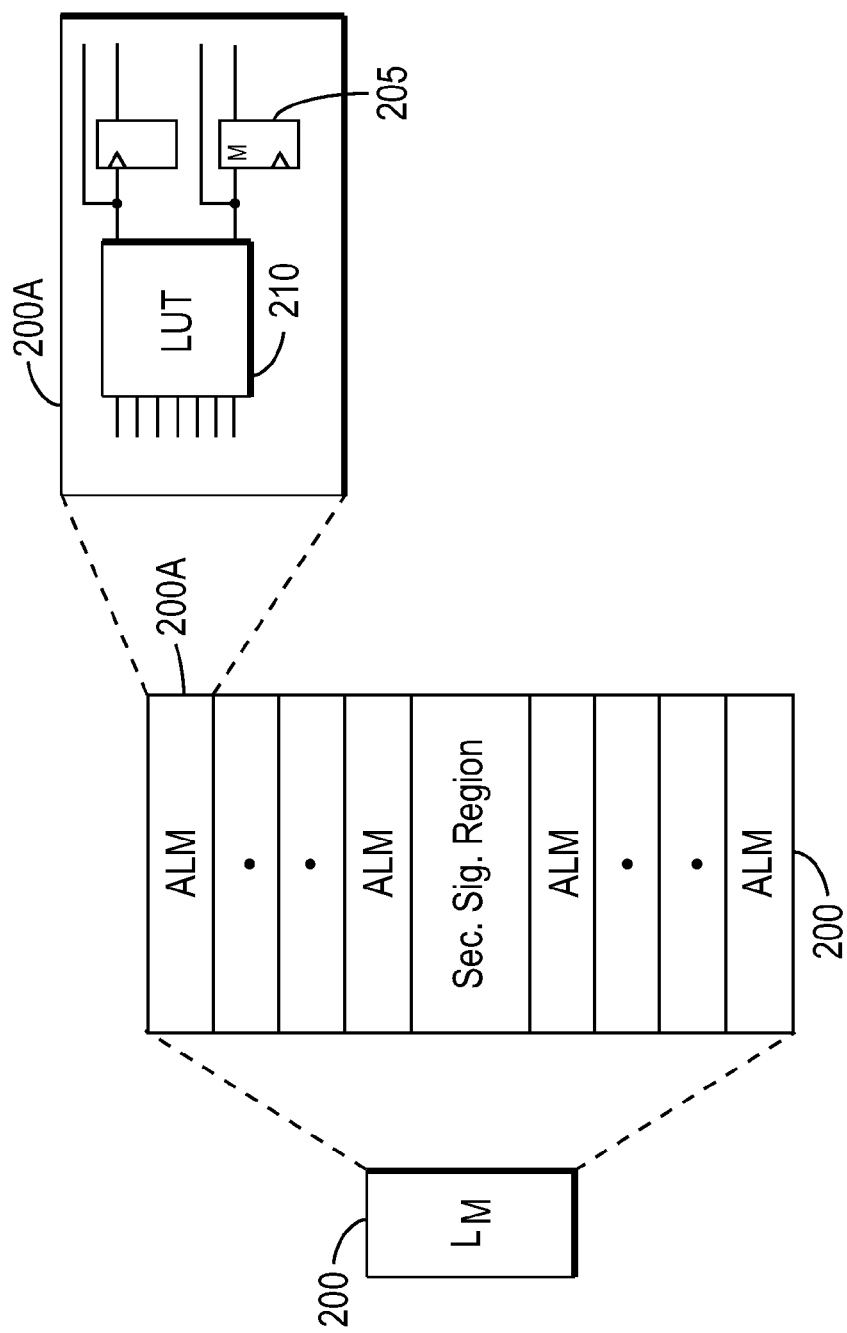
FIGS. 12-17 illustrate simplified block diagrams of PLD configurations that include metastability-hardened storage circuits, according to exemplary embodiments.

FIG. 12 shows a simplified block diagram of such a configuration. LAB 200, labeled as $L_M$, includes at least one metastability-hardened storage circuit. More specifically, as FIG. 12 depicts, LAB 200 includes a set of ALMs (or LEs, as desired). ALM 200A includes at least one metastability-hardened storage circuit. In the example shown, ALM 200A includes LUT 210, and at least one metastability-hardened flip-flop 205.

Figure 13:
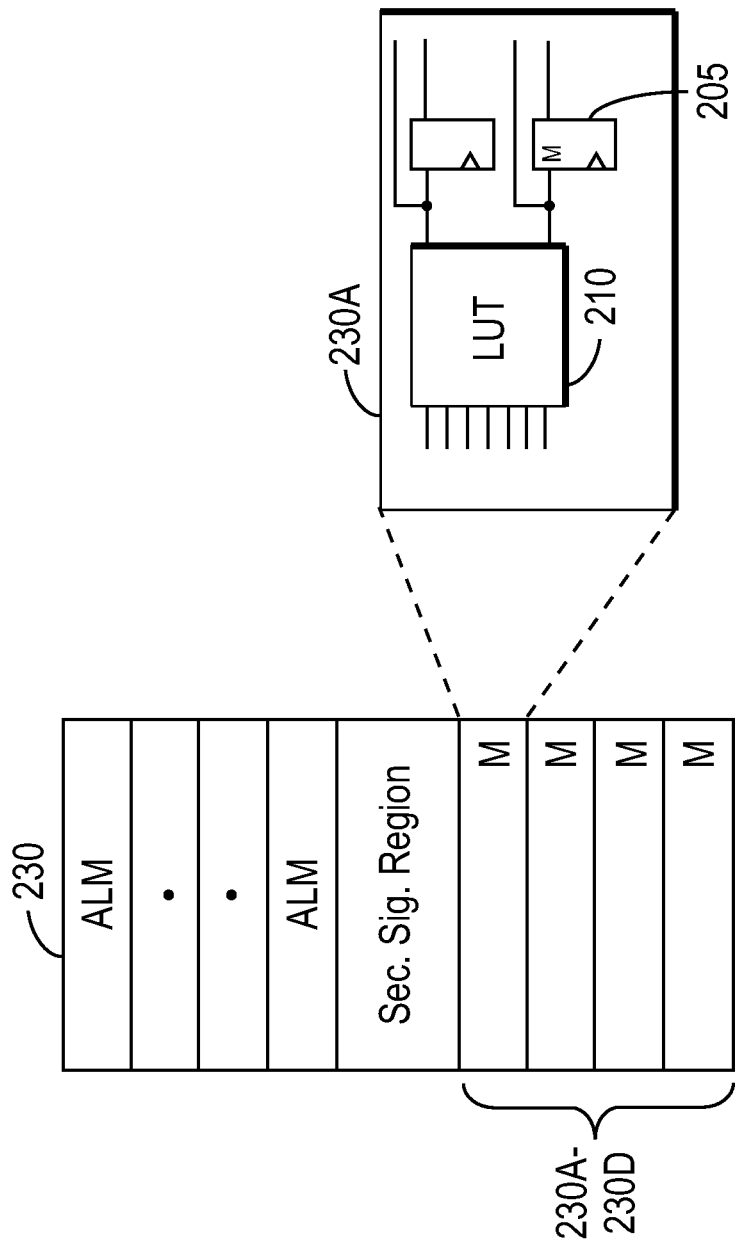

In one embodiment, specific flip-flop(s) in one or more ALM in one or more LABs are metastability-hardened. For example, as FIG. 13 illustrates, LAB 230 includes ALMs 230A-230D, each of which includes at least one metastability-hardened flip-flops 205. In another embodiment, all of the ALMs in one or more LABs include one or more metastability hardened flip-flops. In yet another embodiment, some of the ALMs in one or more LABs include metastability hardened flip-flops.

Figure 14:
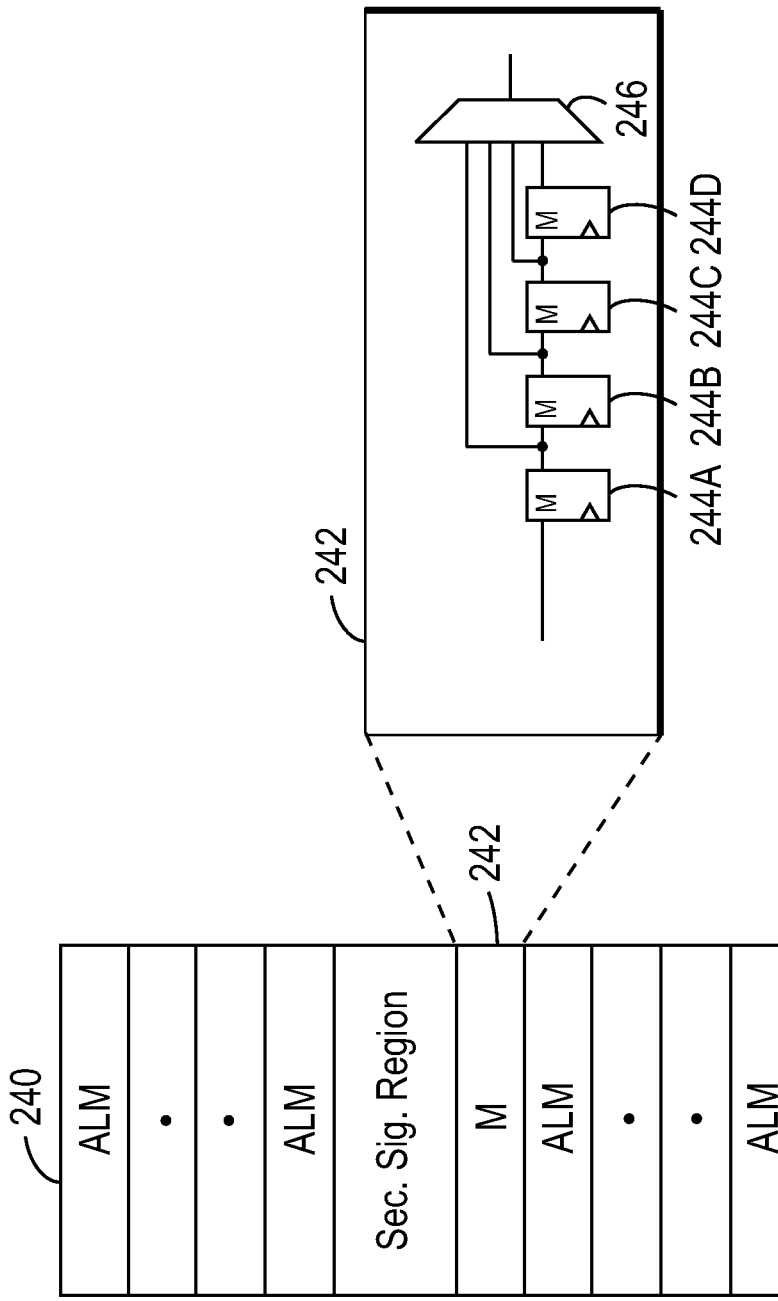

In yet another variation, the metastability hardened storage circuits are included in a specific or separate region in a block of programmable logic circuit. For example, as FIG. 14 illustrates, in one embodiment, LAB 240 includes a region or circuit or block 242 (labeled as M). Region M includes a set of a desired number of metastability-hardened flip-flops, say, four metastability-hardened flip-flops 244A-244D. MUX 246 allows the selection of the output signal of one of the flip-flops in the chain of flip-flops. In another embodiment, the secondary signal region in one or more LABs includes metastability-hardened flip-flops.

One may place metastability-hardened storage circuits in PLDs from a block-level arrangement perspective. In some exemplary embodiments, one may include or place LABs containing metastability-hardened flip-flops at all locations within programmable logic 106.

Figure 15:
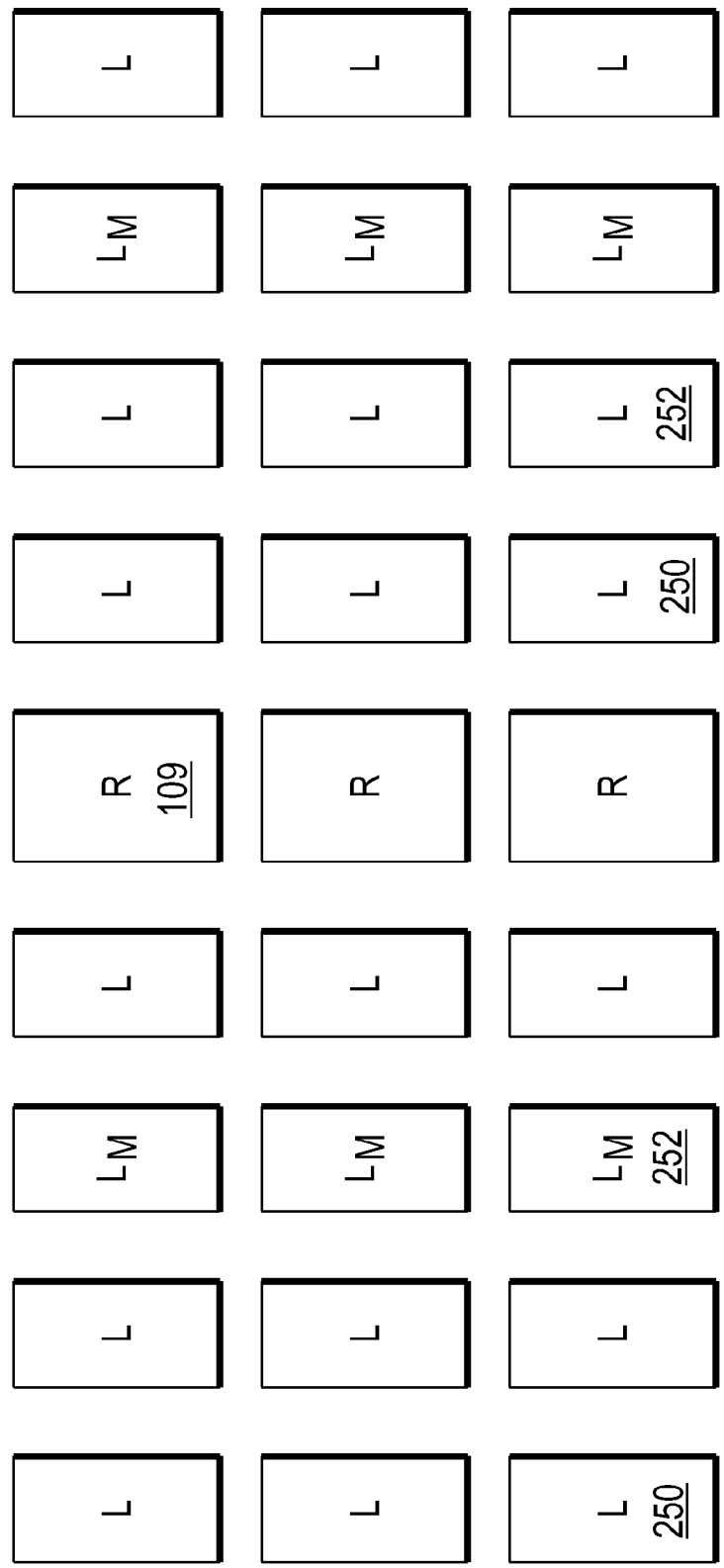

In other exemplary embodiments, some of the circuitry within the programmable fabric of the PLD use metastability-hardened storage circuits, and the rest of the circuitry in the programmable fabric of the PLD does not. For example, as FIG. 15 illustrates, some LABs in the PLD may include metastability-hardened flip-flops, while other LABs may not.

More specifically, LABs 250 (labeled as L) do not include metastability-hardened flip-flops. In contrast, LABs 252 (labeled as $L_M$) include at least one metastability-hardened flip-flop. Programmable routing or interconnect 109 (labeled as R) provides routing among the various resources, such as LABs 250 and 252. In this scenario, given that a subset of the LABs within the PLD (i.e., LABs 252) include metastability-hardened flip-flops, one may use exclusively metastability-hardened flip-flops in LABs 252.

In some exemplary embodiments, PLDs may contain a mixture of LABs that can or cannot be used as memories (i.e., LABs that are configurable into memories vs. LABs that are not configurable into memories). In such embodiments, the LABs which can not be re-configured into memories may include one or more metastability hardened flip-flops.

As an example, asynchronous first-in, first-out (FIFO) circuits are a relatively common application that make use of synchronizer chains as well as memories to store data. By including metastability hardened flip-flop(s) in separate LABs from the ones used as memories (i.e., in LABs that are not configurable as memories), the asynchronous FIFOs' resource demands can be better balanced across the variety of LAB types.

In some embodiments, extra blocks of logic circuitry are included in the PLD core, each of which includes a set of one or more metastability hardened storage circuits, together with configurable routing or interconnect to couple those blocks to the rest of the PLD's fabric. For example, a PLD may include a set of one or more blocks of logic circuitry, each of which includes one or more metastability hardened flip-flops.

Figure 16:
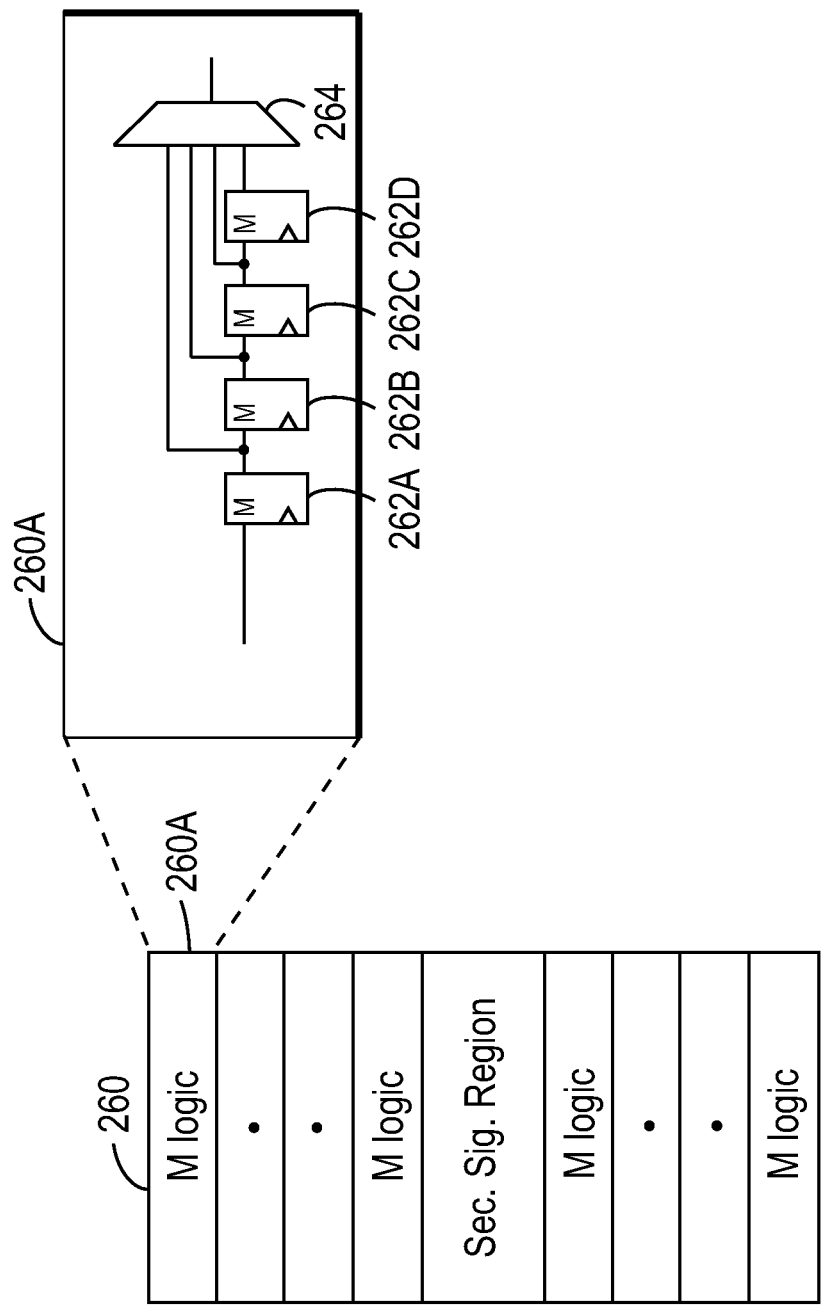

The additional or extra blocks of logic circuitry may contain different, or even no combinational logic, in contrast to the LABs or other programmable logic circuitry in the PLD. FIG. 16 shows an embodiment in which each block of logic circuitry 260 includes a set of logic circuits (labeled as M logic) 260A. Each logic circuit 260A includes metastability-hardened storage circuitry.

In the example shown in FIG. 16, logic circuit 260A includes a set of four metastability-hardened flip-flops coupled in a cascade configuration. MUX 264 provides the capability of selecting the output of one of the flip-flops in the flip-flop chain.

Note that the shift-register arrangement shown in FIG. 15 also tends to decrease the cost of interconnect between or among the flip-flops. More specifically, one may provide the coupling from one flip-flop to another flip-flop using relatively inexpensive hardwired interconnections, rather than the relatively expensive configurable routing or interconnect circuitry. Furthermore, the hardwired coupling between flip-flops maximizes the available resolution time ($t_{met}$) for a sampling flip-flop for a given clock speed.

In some embodiments, the PLD includes blocks of dedicated metastability-hardened storage circuits. Such blocks may be included in the programmable fabric of the PLD, and are available for implementing the user's design using the PLD's resources.

Figure 17:
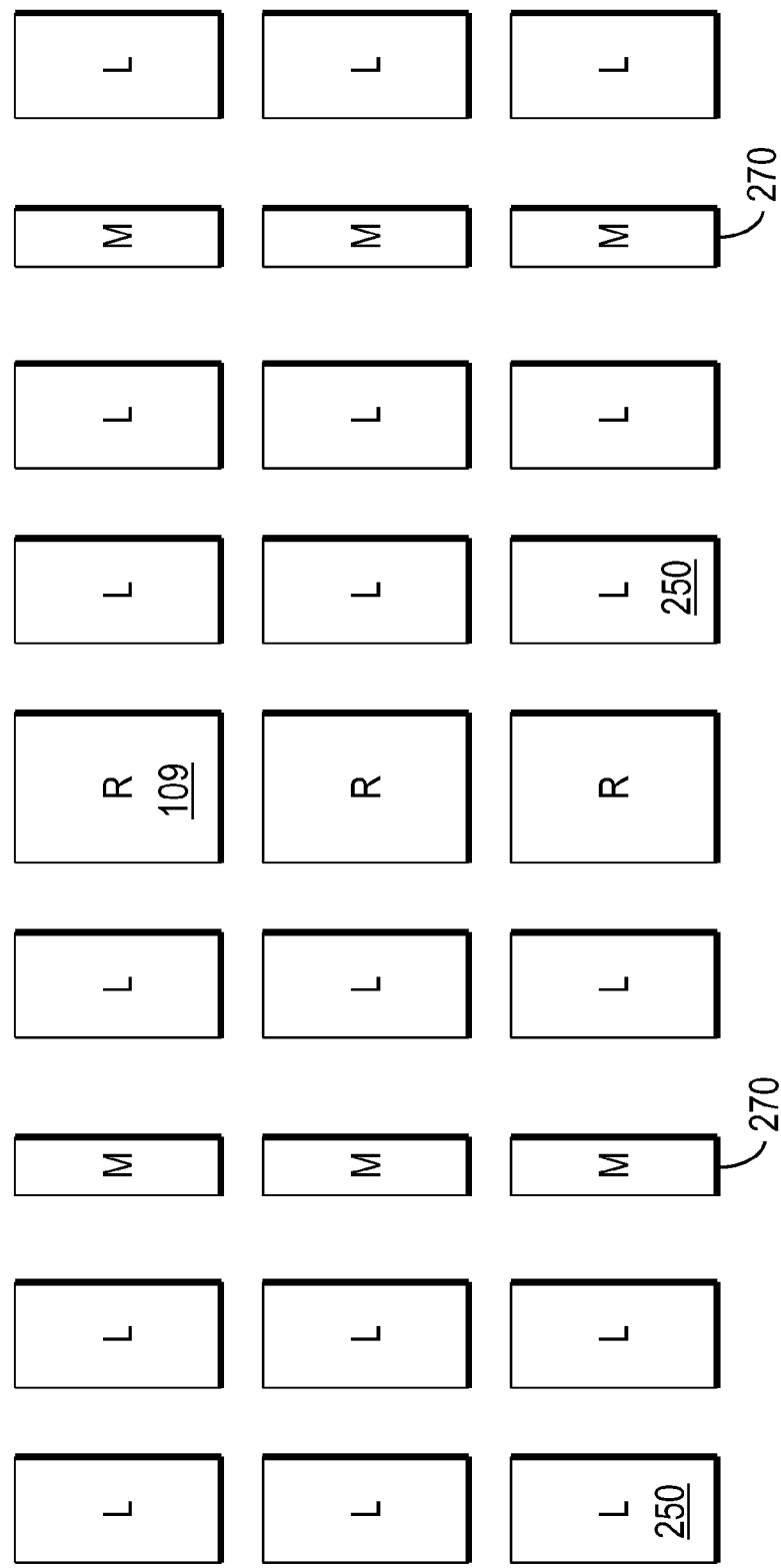

FIG. 17 shows an exemplary embodiment of a PLD that includes at least one logic circuit or block 270 that includes dedicated metastability-hardened storage circuit(s) in addition to LABs 250. More specifically, LABs 250 (labeled as L) do not include metastability-hardened flip-flops. Each of logic block(s) or circuit(s) 270 provides dedicated metastability-hardened storage circuit(s), such as latch(es) and flip-flop(s). Programmable routing or interconnect 109 (labeled as R) provides routing among the various resources, such as LABs 250 and logic block(s) or circuit(s) 270.

As noted above, although the above description concerns in parts the application of the disclosed concepts to PLDs, one may apply the disclosed concepts to a variety of other electronic circuits and devices, by making modifications that fall within the knowledge of persons of ordinary skill in the art who have the benefit of the description of the disclosed concepts. Some examples of such devices include custom, standard-cell, gate-array, structured application specific integrated circuit (ASIC) implementations.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. A method of processing a signal in an integrated circuit (IC), the method comprising processing the signal using a set of metastability-hardened storage circuits in the IC, wherein each metastability-hardened storage circuit comprises: (a) a pulse width distortion circuit; (b) a first circuit powered by a nominal power supply voltage, and a second circuit powered by a higher-than-nominal supply voltage; (c) an inverter and a bias circuit, wherein the bias circuit provides a bias current based on an intermediate state of the inverter to resolve a metastable state of the inverter; or (d) a latch, and a dynamic bias circuit that causes current to be injected into the latch to resolve a metastable state of the latch.

2. The method according to claim 1, wherein at least one metastability-hardened storage circuit in the set of metastability-hardened storage circuits is included in a corresponding set of at least one block of logic circuitry in a hierarchical set of blocks of logic circuitry in programmable logic circuitry.

3. The method according to claim 2, wherein the metastability-hardened storage circuit is included in a specific region of the programmable logic circuitry.

4. The method according to claim 2, wherein a first block of logic circuitry in the hierarchical set of blocks of logic circuitry includes a metastability-hardened storage circuit, and a second block of logic circuitry in the hierarchical set of blocks of logic circuitry lacks a metastability-hardened storage circuit.

5. The method according to claim 4, wherein each of the first and second blocks of logic circuitry in the hierarchical set of blocks of logic circuitry comprises a logic array block (LAB).

6. The method according to claim 5, wherein the logic array block (LAB) in the first block of logic circuitry in the hierarchical set of blocks of logic circuitry comprises a metastability-hardened storage circuit in the set of metastability-hardened storage circuits.

7. The method according to claim 2, wherein the set of metastability-hardened storage circuits is included in a corresponding set of at least one logic block coupled to the programmable logic circuitry.

8. The method according to claim 7, wherein the set of metastability-hardened storage circuits are dedicated to the set of at least one logic block.

9. The method according to claim 2, further comprising driving an input of a first metastability-hardened storage circuit in the set of metastability-hardened storage circuits with an output of a second metastability-hardened storage circuit in the set of metastability-hardened storage circuits.

10. The method according to claim 2, wherein the IC further comprises programmable interconnect that couples at least first and second metastability-hardened storage circuits in the set of metastability-hardened storage circuits to increase a timing slack.

11. The method according to claim 2, wherein the hierarchical set of blocks of logic circuitry comprises a plurality of logic array blocks (LABs).

12. The method according to claim 11, wherein each of the logic array blocks (LABs) in the hierarchical set of blocks of logic circuitry comprises at least one adaptive logic module (ALM).

13. A method of processing a signal in an integrated circuit (IC), the method comprising processing the signal using a metastability-hardened storage circuit having an inverter and a dynamic bias circuit to provide a bias current, wherein processing the signal further comprises using the bias current to resolve a metastable state of the inverter.

14. The method according to claim 13, wherein using the bias current to resolve a metastable state of the inverter further comprises providing the bias current to an output of the inverter.

15. The method according to claim 13, wherein the inverter comprises a p-type transistor and an n-type transistor, and wherein using the bias current to resolve a metastable state of the inverter increases a transconductance of the n-type transistor.

16. A method of operating a storage circuit comprising a latch and a dynamic bias circuit, the method comprising:
    injecting current provided by the dynamic bias circuit into the latch to resolve a metastable state of the latch; and
    ceasing injection of current into the latch when the metastable state of the latch resolves.

17. The method according to claim 16, wherein injecting current provided by the dynamic bias circuit into the latch further comprises injecting current from first and second transistors in the bias circuit into first and second inverters in the latch.

18. The method according to claim 17, wherein injecting current from first and second transistors in the bias circuit into first and second inverters in the latch further comprises injecting current into an output of the first inverter in response to a clock signal, and injecting current into an output of the second inverter in response to the clock signal.

19. The method according to claim 16, wherein ceasing injection of current into the latch further comprises using a third transistor in the bias circuit to cease injecting current into the output of the first inverter when a metastable state of the first inverter resolves.

20. The method according to claim 19, wherein ceasing injection of current into the latch further comprises using a fourth transistor in the bias circuit to cease injecting current into the output of the second inverter when a metastable state of the first inverter resolves.

* * * * *